US006998293B2

(12) United States Patent
Achari et al.

(10) Patent No.: US 6,998,293 B2
(45) Date of Patent: Feb. 14, 2006

(54) FLIP-CHIP BONDING METHOD

(75) Inventors: Achyuta Achari, Canton, MI (US); Mohan R. Paruchuri, Canton, MI (US); Raja-Sheker Bollampally, Farmington Hills, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 359 days.

(21) Appl. No.: 10/113,388

(22) Filed: Mar. 29, 2002

(65) Prior Publication Data

US 2003/0183951 A1 Oct. 2, 2003

(51) Int. Cl.
*H01L 21/44* (2006.01)
*H01L 21/48* (2006.01)
*H01L 21/50* (2006.01)

(52) U.S. Cl. ...................................................... 438/108

(58) Field of Classification Search ................ 438/108, 438/124, 127, 612–614; 228/180.22
See application file for complete search history.

(56) References Cited

U.S. PATENT DOCUMENTS 5,128,746 A * 7/1992 Pennisi et al. .............. 257/738
5,704,116 A 1/1998 Gamota et al.
5,843,251 A * 12/1998 Tsukagoshi et al. .......... 156/64
5,975,408 A 11/1999 Goossen
6,069,024 A * 5/2000 Murakami .................. 438/108
6,189,208 B1 2/2001 Estes et al.
6,209,196 B1 4/2001 Ozono et al.
6,219,911 B1 4/2001 Estes et al.
6,309,908 B1 * 10/2001 Sarihan et al. .............. 438/106
6,365,435 B1 * 4/2002 Wang et al. ................ 438/108

OTHER PUBLICATIONS

Lau, Flip Chip technologies, McGraw-Hill, 1996, pp. 226-228 & 419, 427-435.*

* cited by examiner

*Primary Examiner*—David A. Zarneke
(74) *Attorney, Agent, or Firm*—Brinks Hofer Gilson & Lione

(57) ABSTRACT

The present invention is generally directed towards a flip chip assembly. In particular a new bonding process for bonding an electronic component to the substrate is disclosed. The method comprises the steps of forming at least one solder pad on the electronic component and forming at least one bond pad on the substrate wherein the at least one bond pad has a top layer formed of a metal. Placing an underfill film on top of the at least one bond pad and heating the electronic component and the substrate. Moving the electronic component towards the substrate such that the at least one solder pad is aligned on top of the at least one bond pad and finally forming a bond between the at least one solder pad and the top layer of the at least one bond pad.

10 Claims, 6 Drawing Sheets

FLIP-CHIP BONDING METHOD

TECHNICAL FIELD

This invention generally relates to flip chip assembly. More specifically to a flip chip assembly and a method of forming the flip chip assembly.

BACKGROUND

Flip chip mounting is an increasingly popular technique for directly electrically connecting an integrated circuit chip to a substrate such as a circuit board. In this configuration, the active face of the chip is mounted face down, or "flipped" on the substrate. The electrical bond pads on the flip chip are aligned with corresponding electrical bond pads on the substrate, with the chip and substrate bond pads electrically connected by way of an electrically conductive material. The flip chip mounting technique eliminates the use of bond wires between a chip or chip package and the substrate, substantially increases the reliability of the chip-to-substrate bond.

As a means for mounting integrated circuit chips to a substrate, there has been known a number of methods which form solder portions, such as solder bumps and solder precoats, on the integrated circuit chip and joins the integrated circuit chip to a substrate by means of the solder portions. Typically, the soldering process involves applying a flux to substrate and mounting the integrated circuit chip to a substrate, and heating and melting the solder to join the solder portions. After the solder joints have been formed, the assembly is subjected to cleaning to remove flux residues to enhance the reliability after the mounting.

Additionally the resulting assembly typically undergoes further thermal cycling during additional assembly operations. The final assembly also is exposed to wide temperature changes in the service environment. The integrated circuit chip is typically silicon and the substrate may be epoxy, or ceramic. Both the material of the integrated circuit chip and the substrate frequently have thermal expansion coefficients that are different from one another, and are also different from the thermal expansion coefficient of solder. The differential expansion that the assembly invariably undergoes results in stresses on the solder bonds which can cause stress cracking and ultimately failure of the electrical path through the solder bond. To avoid solder bond failures due to mechanical stress, the gap between the surfaces joined by the bond is typically filled with an underfill material.

Conventionally, the underfill material is dispensed between the chip and the substrate. The underfill material is typically provided as a liquid adhesive resin that can be dried or polymerized. The underfill material provides enhanced mechanical adhesion and mechanical and thermal stability between the flip chip and the substrate, and inhibits environmental attack of chip and substrate surfaces. The underfill material also fills the gaps between the bumped electronic parts and the board to reinforce the joints. The underfill resin is then hardened by heat treatment, thus completing the mounting process.

The mounting process described above, however, poses the following problems as the use of such solvents as fluorocarbon are not considered environmentally safe. Further, the cleaning process after soldering has become complicated and risen in cost, which, combined with on-going reductions in the size of integrated circuit chip, has contributed to making the cleaning process technically difficult. As to the underfill resin, since the gaps between the integrated circuit chip and the substrate is minimized to a need for smaller components filling of the underfill after the mounting of electronic components difficult, resulting in unstable quality of the assembly. In addition to this quality problem, the above conventional mounting method has another problem that it requires two heating processes for the mounting of each component, one for soldering and one for hardening the resin, thus complicating the process. Additionally, in some cases entrapped air, or incomplete wetting of the surfaces of the space being filled, inhibits flow or prevents wicking, causing voids in the underfill. The above method also has another problem that it requires two heating processes. One for mounting the integrated circuit chip to the substrate and the other for hardening the resin, thereby complicating the process and the time for manufacturing the assembly.

Therefore, there is a need in the flip-chip bonding industry to have a process that substantially reduces cure time for the underfill and at the same time having a more reliable bond.

SUMMARY

In accordance with one aspect of the present invention a semiconductor assembly comprises an electronic component such as an integrated circuit chip attached to a substrate such as a circuit board. The electronic component is provided with a solder pad that forms a metallurgical bond with the top surface of a bond pad provided in the substrate.

In yet another aspect, a first method of bonding the electronic component to a substrate is disclosed. The method comprises the step of forming a solder pads on a surface of the electronic component. The solder pads are preferably Au/Sn eutectic solder pads. Forming a bond pad on a surface of the substrate. The bond pad comprises a top layer formed of gold. Placing an underfill material on top of the surface of the substrate. The method also comprises the step of heating the electronic component and the substrate. Moving the electronic component towards the substrate such that the solder pads are aligned above the bond pads and forming a diffusion bond between the solder pads and the top layer of the bond pads.

In yet another aspect of the present invention, a second method of bonding the electronic component to a substrate is disclosed. The method comprises the step of forming a solder pads on a surface of the electronic component. The solder pads are preferably Au/Sn eutectic solder pads. Forming a bond pad on a surface of the substrate. The bond pad comprises a top layer formed of gold. Placing an underfill material on top of the surface of the substrate. The method also comprises the step of heating the electronic component and the substrate. Moving the electronic component towards the substrate such that the solder pads are aligned above the bond pads and heating the assembly such that the solder material reflows and forms a metallurgical bond with the top layer of the bond pads on the substrate.

Further aspects, features and advantages of the invention will become apparent from consideration of the following description and the appended claims when taken in connection with the accompanying drawings.

DETAILED DESCRIPTION

The following description of the preferred embodiment is merely exemplary in nature and is in no way intended to limit the invention or its application or uses.

Figure 1:
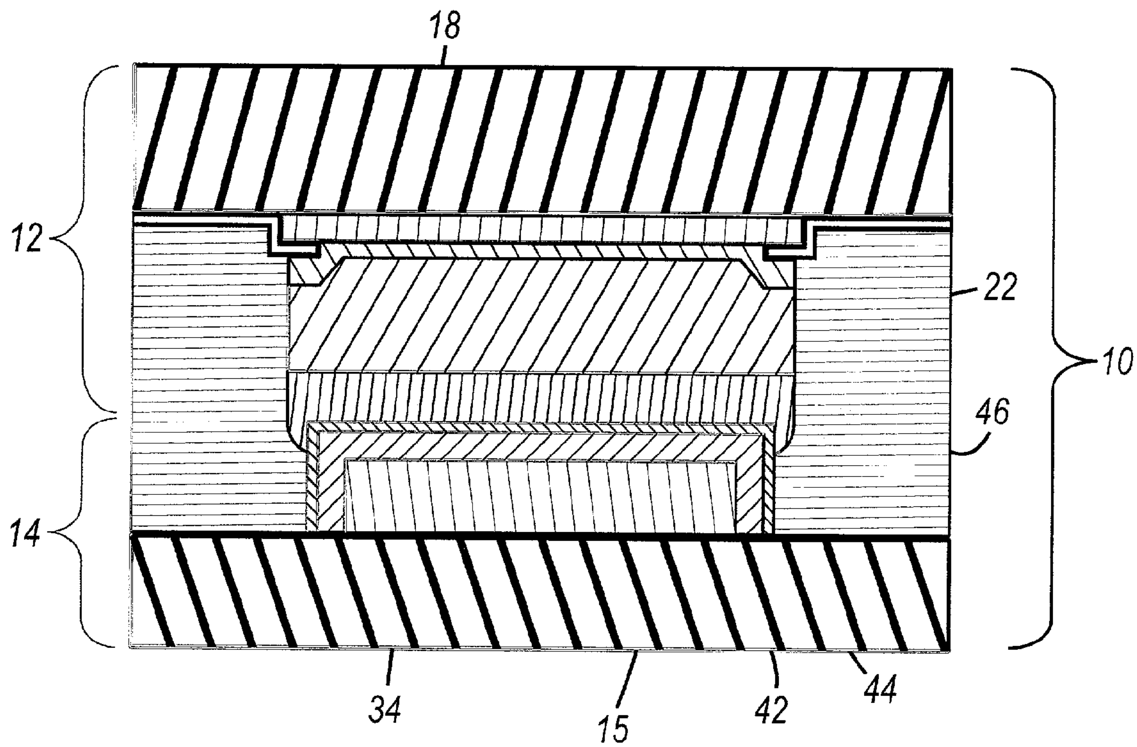
FIG. 1 is a cross sectional view of the electronic component mounted on top of a substrate to form the electronic assembly in accordance with the teachings of the present invention.

Referring in particular to FIG. 1 an electronic assembly, such as a semiconductor assembly is generally shown and represented by reference numeral 10. The assembly 10 comprises an electronic component 12 positioned above a substrate 14. Electronic component 12 is an integrated circuit or a flip chip adapted for mounting on a substrate 14 by a flip-chip process.

The electronic component 12 is comprises a base 16. Preferably the base 16 is formed of silicon and has an active surface 18. A plurality of electrically conductive electrodes 20 are mounted on the active surface 18 of the electronic component 12. The electrodes 20 include an integrally attached eutectic solder pad 22. As will be explained in details later the electronic component 12 is directly attached to the substrate 14 through the solder pad 22 formed on the active surface 18 of the electronic component 12.

Referring in particular to FIGS. 2A to 2H, a method of forming the eutectic solder pad 22 on the active surface 18 of the electronic component 12 is shown. The method comprises the step of first forming the electrodes 20. A first layer 24 of an electrode base is deposited on the active surface 18 (shown in FIG. 2A). Preferably, the first layer 24 is formed of aluminum. A second layer 26 preferably of Ti/W alloy and Au is deposited on top of the first layer 24 by the sputtering deposition process (shown in FIG. 2B). Alternatively, the first layer 24 may be pretreated with zincate and subject to electroless nickel deposition. A photoresist material 28 is then etched on the active surface 18 and partially over the second layer 24 (shown in FIG. 2C). A third layer 30 preferably of gold is then electroplated on top of the second layer 26 (shown in FIG. 2D). This step is then followed by electroplating a fourth layer 32 preferably tin on top of the third layer 30 (shown in FIG. 2E). The photoresist material 28 is then removed and the second layer 26 is etched away from the active surface 18 of the substrate 16 (shown in FIGS. 2F and 2G).

Figure 2A:
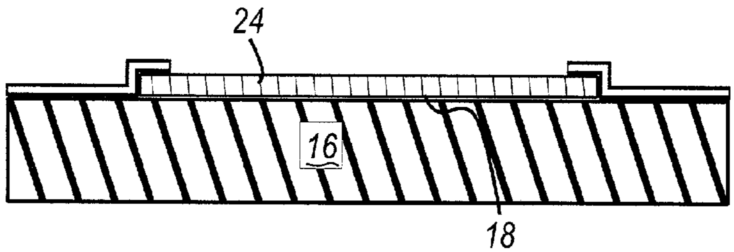
FIGS. 2A to 2H is a cross sectional representation of forming a solder pad on the electronic component in accordance with the teachings of the present invention.
Figure 2B:
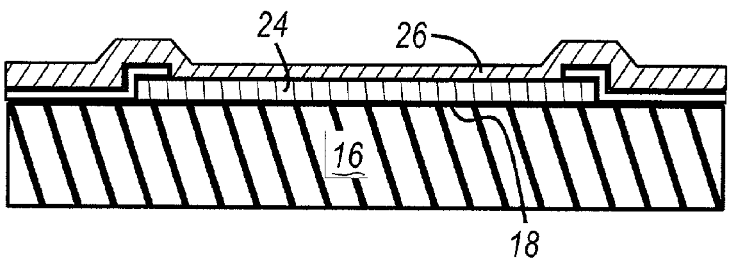
Figure 2C:
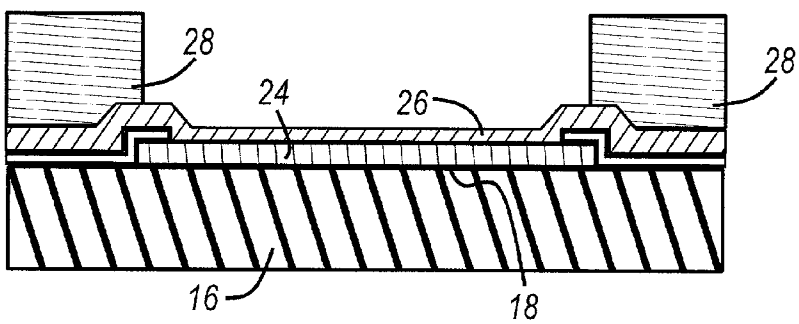
Figure 2D:
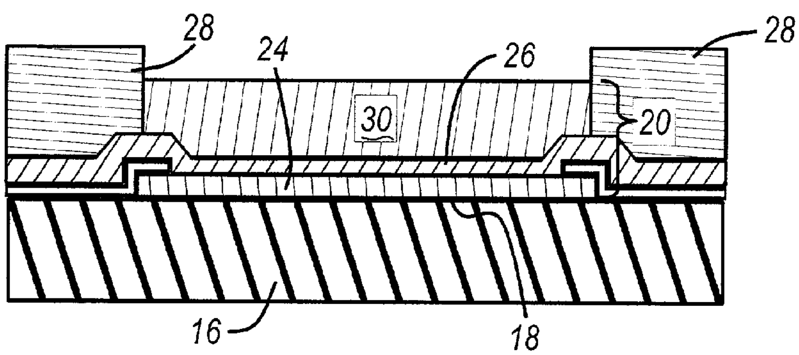
Figure 2E:
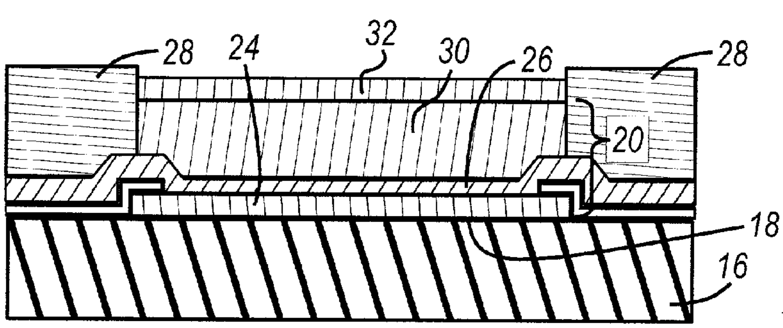
Figure 2F:
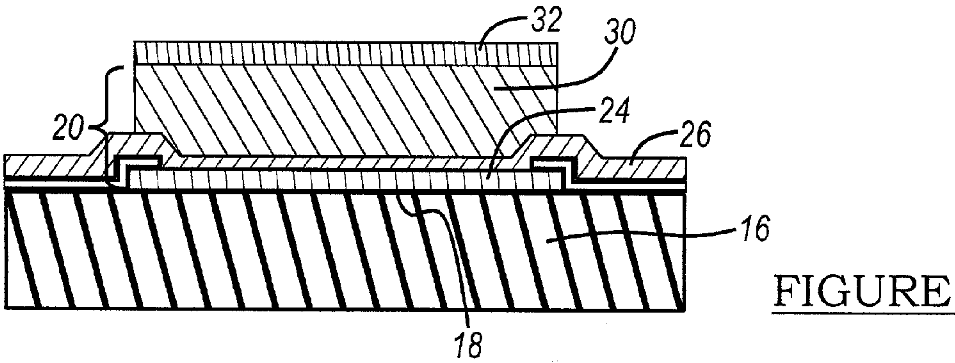
Figure 2G:
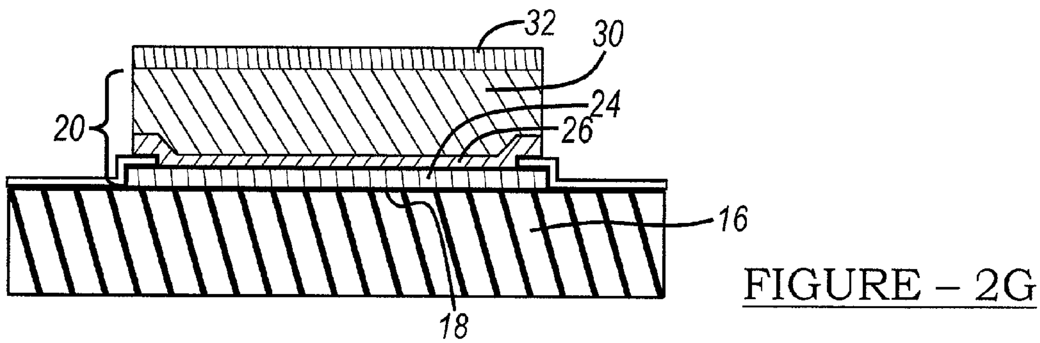
Figure 2H:
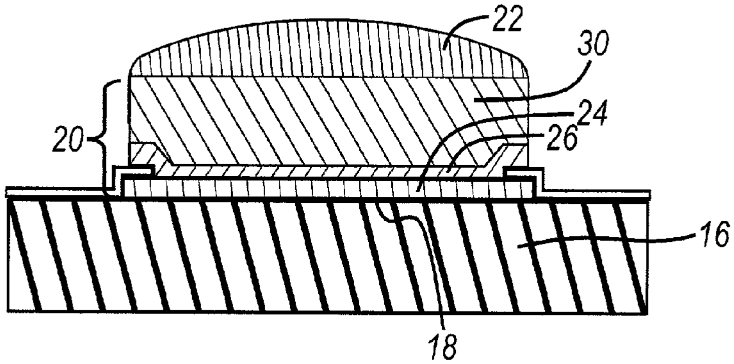

Referring in particular to FIG. 2H, in order to form the eutectic solder pad 22, the third layer 30 and the fourth layer 32 are reflowed to form eutectic solder pad 22. Preferably, the eutectic solder pad 22 is formed of gold/tin alloy. Alternatively, other metals such as tin/lead alloys may be used to form the eutectic solder pad 22. As shown in FIG. 2H, the eutectic solder pad 22 is dome shaped having a bottom periphery 23. As will be explained later, the dome shape of the eutectic solder pad 22 will facilitate the bonding of the electronic component 12 to the substrate 14. Although the dome shaped is preferred, it must be understood that the solder pad 22 may have other shapes.

Referring in particular to FIG. 1, the substrate 14 also defines a base 15. The substrate 12 is preferably a printed circuit board and the base 15 is formed a composite material or a ceramic material. The base 15 has a surface 34 on which plurality of substrate bond pads 36 are mounted. The substrate bond pads 36 facilitate the bonding of the electronic component 12 to the substrate 14. The substrate bond pads 36 are preferably composed of a first layer 40 preferably a solder wettable copper. The first layer 40 is coated with a second layer 42 of a second metal. Preferably, the second metal forming the second layer 42 is nickel. Finally, a top layer 44 of a third metal is coated or deposited on top of the second layer 42. In the preferred embodiment, the third metal forming the top layer 44 is gold. Alternatively, the substrate bond pads 36 have a composition of Ti/Ni/Au or other metals may be used that adheres well to the materials used to form the solder pad 22.

In order to substantially increase the reliability of the bonding between the electronic component 12 and the substrate 14, an underfill material 46 is disposed on the surface 34 of the substrate 14. The underfill material 46 is disposed such that the underfill material 46 forms a thin layer over the top layer 44 of the substrate bond pads 36. Preferably, the underfill material 46 is in form of a film and contains 30% to 40% of a solid filler material. The underfill material 46 reduces the thermal expansion stresses caused due to the difference in the coefficient of thermal expansion of the electronic component 12 and the substrate 14. The solid filler material in the underfill material 46 is preferably an inorganic material such as silica. Alternatively, the filler may comprise an organic materials such as resin.

Figure 3A:
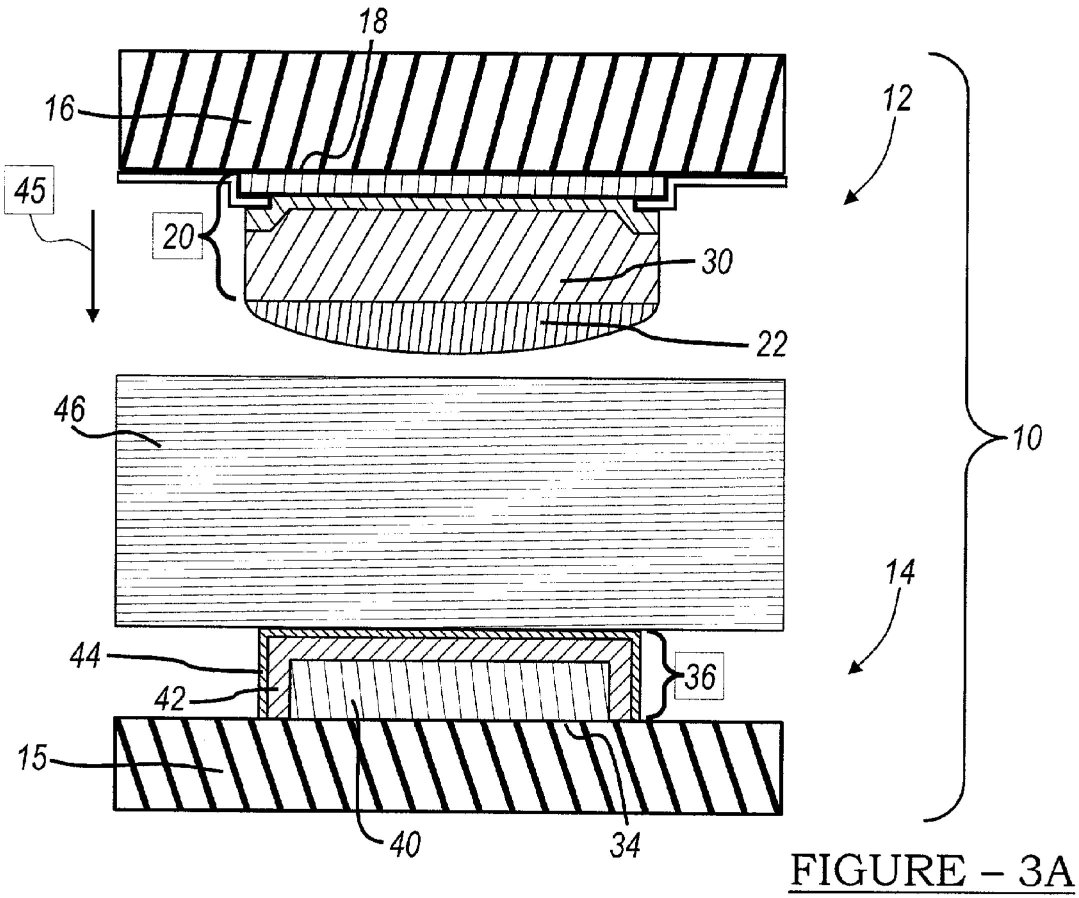
FIG. 3A is a cross sectional representation of the electronic component being mounted to a substrate by a first method in accordance with the teachings of the present invention.
Figure 3B:
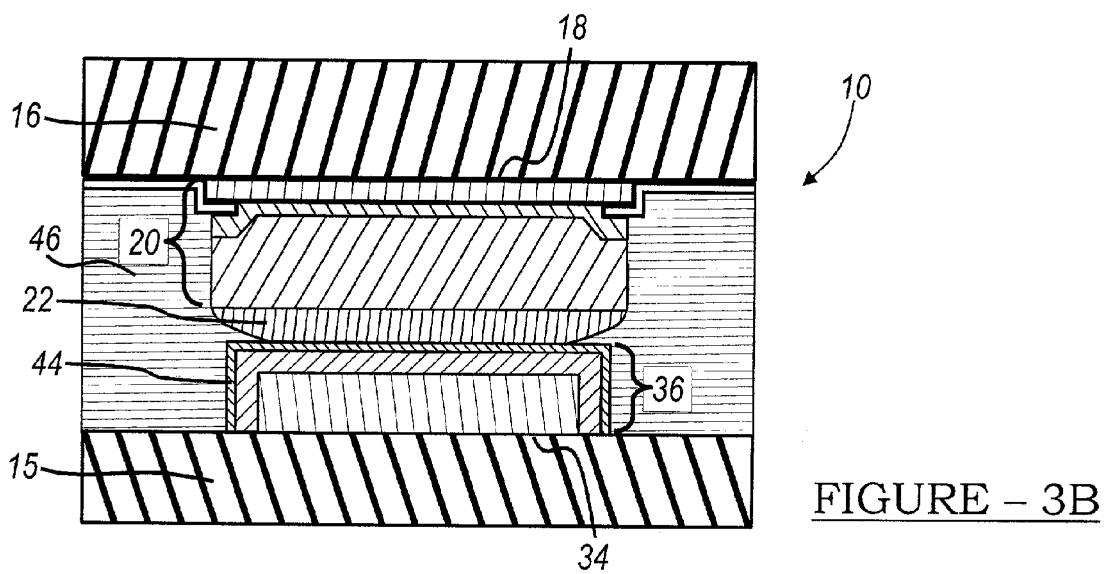
FIG. 3B is a cross sectional representation of forming a bond between the electronic component and the substrate by the first method, in which the solder pad of the electronic component pierce an underfill film on the substrate to form the bond with the top layer, in accordance with the teachings of the present invention.

The first method of bonding the electronic component 12 to the substrate 14 is now described by referring to FIGS. 3A to 3D. As shown in FIG. 3A, the active surface 18 of the electronic component 12 having the solder pad 22 is placed above the surface 34 of the substrate 14. The electronic component 12 is held above the substrate 14 by a holding means (not shown). The electronic component 12 is flipped such that solder pad 22 directly face the surface 34 of the substrate 14. The electronic component 12 is then heated to a temperature in the range of 220° C. to 260° C. through a heating element (not shown). The substrate 14 is also simultaneously heated to a temperature of about 75° C. to 100° C. The heating of the substrate 14 will result in softening of the underfill material 46. The electronic component 12 is then moved towards the substrate 14 as shown by arrows 45 such that the solder pad 22 is aligned on top of the substrate bond pads 36. The method further comprises the step of applying pressure on the electronic component 12 such that the solder pad 22 penetrate the underfill material 46 to directly contact the top layer 44 of the substrate bond pads 36 (shown in FIG. 3B). In this method the electronic component 12 and the substrate 14 are heated below the melting point of the solder pad 22 such that diffusion or a thermo-compression bond is formed between the solder pad 22 and the top layer 44 of the substrate bond pad 36. As seen in FIG. 3B, the dome shape of the solder pad 22 is retained and only the bottom periphery 23 of the solder pad 22 forms a bond with the top layer 44 of the substrate bond pad 36. Preferably, the bond is formed at around 250° C.

Figure 4A:
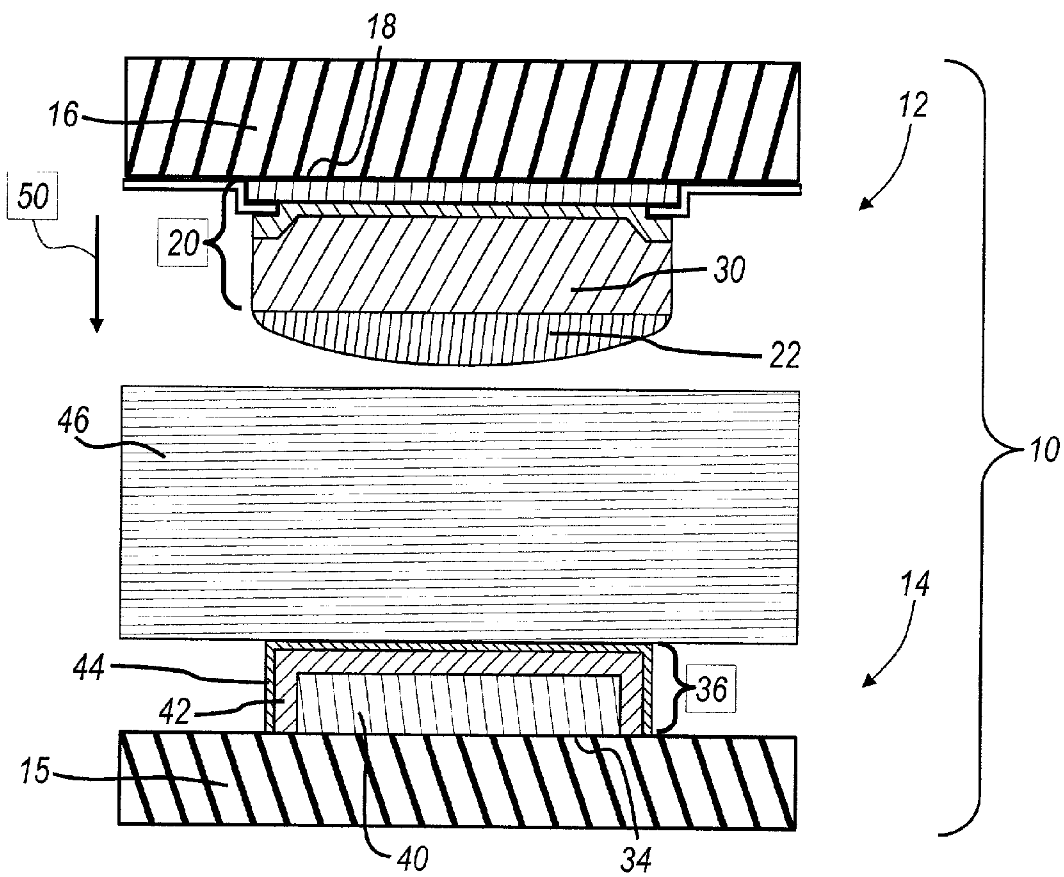
FIG. 4A is a cross sectional representation of the electronic component being mounted to a substrate by a second method in accordance with the teachings of the present invention.
Figure 4B:
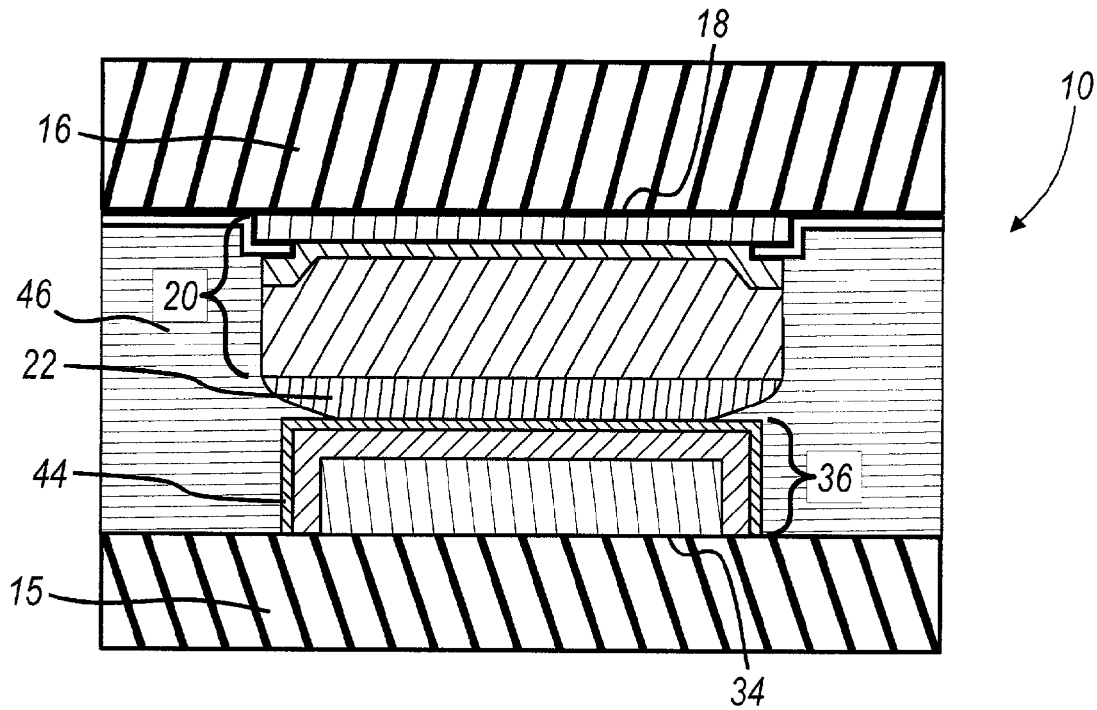
FIG. 4B is a cross sectional representation of forming an intermediate bond between the electronic component and the substrate by the second method, in which the solder pad of the electronic component pierce an underfill film on the substrate to form the bond with the top layer, in accordance with the teachings of the present invention.
Figure 4C:
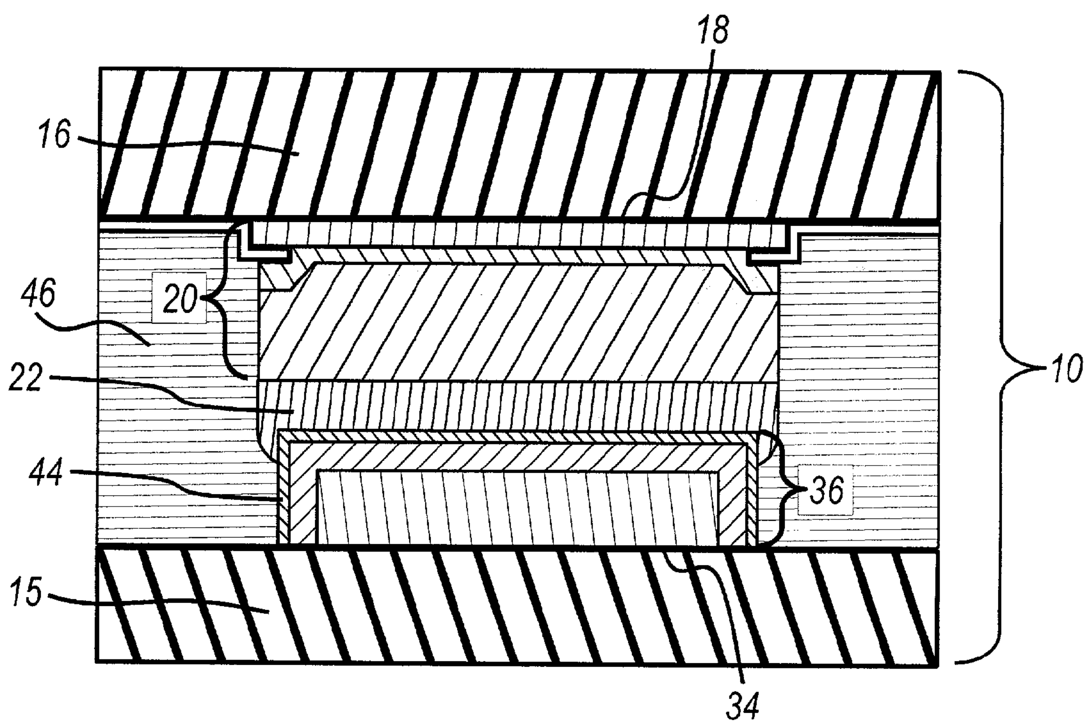
FIG. 4C is a cross sectional representation of forming a bond between the electronic component and the substrate by the second method, in which bond is formed by the reflow of the solder pad on top of the top layer, in accordance with the teachings of the present invention.

FIGS. 4A to 4C represent the alternative process of attaching the electronic component 12 to the substrate 14. Referring in particular to FIG. 4A, like the first method, the electronic component 12 is placed on top of the substrate 14 such that the active surface 18 of the electronic component 12 is facing the surface 34 of the substrate 14. The electronic component 12 is then heated to about 230° C. to about 260° C. The substrate 14 is also heated to about 75° C. to about 100° C. As the electronic component 12 is moved towards the substrate 14 as shown by arrows 50, pressure is applied on the electronic component 12. The amount of pressure applied in approximately 150 grams/bump such that the solder pad 22 penetrate the underfill material 46 (shown in FIG. 2A). As seen in FIG. 4B, the solder pad 22 is placed directly in contact with the top layer 44 of the substrate bond pads 36. When the electronic component 10 is placed on top of the substrate 14, a bond similar to the bond formed in the first method is first formed represented in FIG. 4B.

Referring in particular to FIG. 4C, the assembly 10 comprising the electronic component 12 on top of the substrate 14 is then heated to a temperature of about 300° C. Heating the assembly 10 at this temperature will cause the solder pad 22 to melt and reflow thereby forming a metallurgical bond between the solder pad 22 and the top layer 44 of the substrate bond pad 36. In this method as shown in FIG. 1 and FIG. 4C, the top layer 44 is encapsulated by the reflowed solder pad 22. Therefore, in this method the metallurgical bond is formed by vertical compression and horizontal expansion of the solder pad 22. This result in more surface area contact thereby forming a strong bond between the electronic component 12 and the substrate 14.

It should be noted that the method of attaching the electronic component 12 to a substrate 14 is not limited to the embodiments discussed above. With this invention because an underfill material 46 having a filler material is applied to the surface of the substrate before the attachment of the electronic component it accomplishes bonding of the electronic component 12 to the substrate 14 and the curing of the underfill material 46 occurs simultaneously. The bonding process therefore eliminates the need for an additional underfill step, thereby eliminating the additional cost of equipment and increasing the production output. Since the above discussed methods involve vertically compressing and laterally expanding solder pads 22 as they attach to the top layer 44 of the substrate bond pads 36, it substantially eliminates the production of voids between the solder pad 22 and the substrate 14. As a result the bonding method of the present invention results in a more reliable bond between the electronic component 12 and the substrate 14 to result in a more robust assembly 10.

As any person skilled in the art will recognize from the previous description and from the figures and claims, modifications and changes can be made to the preferred embodiment of the invention without departing from the scope of the invention as defined in the following claims.

What is claimed is:

1. A method of interconnecting an electronic component having an active surface to a substrate, the method comprising:

forming at least one solder pad on the active surface of the electronic component;

forming at least one bond pad on the substrate wherein the at least one bond pad has a top layer formed of a metal;

placing an underfill material on top of the at least one bond pad;

moving the electronic component towards the substrate such that the at least one solder pad is aligned on top of the at least one bond pad;

heating the electronic component having the at least one solder pad to a first temperature in the range of 220° C. to 260° C.;

heating the substrate having the at least one bond pad and the underfill material to a second temperature to soften the underfill material;

applying pressure on the electronic component such that the at least one solder pad penetrates the underfill material to contact the top layer of the at least one bond pad to form an electronic assembly;

heating the electronic assembly to a predetermined temperature to reflow the at least one solder pad; and forming a metallurgical bond between the at least one solder pad and the top layer of the at least one bond pad.

2. The method of claim 1 wherein the second temperature is in the range of 75° C. to about 100° C.

3. The method of claim 1 wherein the forming of the at least one solder pad comprises:

depositing a first layer of an electrode pad on the active surface of the electronic component wherein the first layer is formed of aluminum;

depositing a second layer on top of the first layer wherein the second layer is formed of a Ti/W and gold alloy;

applying photoresist material;

electroplating a third layer on top of the second layer and in an opening formed in the photoresist material wherein the third layer is formed of gold;

electroplating a fourth layer on top of the third layer wherein the fourth layer is formed of tin reflowing the third and the fourth layers to form the at least one solder pad.

4. The method of claim 1 wherein the at least one solder pad is formed of a gold, tin alloy.

5. The method of claim 1 wherein the at least one solder pad has a dome shaped having an periphery, wherein the periphery forms the metallic bond with the top layer of the at least one bond pad.

6. The method of claim 1 wherein the metal top layer is gold.

7. The method of claim 1 wherein the predetermined temperature is about 300° C.

8. The method of claim 1 wherein the underfill material is a filled underfill film having 30% to 40% of a solid filler material.

9. The method of claim 8 wherein the solid filler material is silica.

10. A method of interconnecting electronic component having an active surface to a substrate, the method comprising:

forming at least one solder pad mounted on the active surface of the electronic component, the solder pad being formed of a gold, tin alloy;

forming at least one bond pad on the substrate wherein the at least one bond pad has a top layer formed of a metal;

placing an underfill material on top of the at least one bond pad;

moving the electronic component towards the substrate such that the at least one solder pad is aligned on top of the at least one bond pad;

applying pressure on the electronic component such that the at least one solder pad penetrates the underfill material to contact the top layer of the at least one bond pad to form an electronic assembly;

healing the electronic component having the at least one solder pad to a first temperature, wherein the first temperature is in the range of 220° C. to 260° C.; and heating the substrate having the at least one bond pad and the underfill material to a second temperature to soften the underfill material and wherein the second temperature is in the range of 75° C. to about 100° C.; and forming a metallurgical bond between the at least one solder pad and the top layer of the at least one bond pad.

* * * * *

UNITED STATES PATENT AND TRADEMARK OFFICE
CERTIFICATE OF CORRECTION

PATENT NO. : 6,998,293 B2
APPLICATION NO. : 10/113388
DATED : February 14, 2006
INVENTOR(S) : Achyuta Achari et al.

It is certified that error appears in the above-identified patent and that said Letters Patent is hereby corrected as shown below:

In the Claims

Column 6, in claim 10, line 65, before “on the active” delete “mounted”.

Column 8, in claim 10, line 1, before “the electronic component” delete “healing” and substitute --heating-- in its place.

Signed and Sealed this

First Day of August, 2006

JON W. DUDAS
*Director of the United States Patent and Trademark Office*